(12) United States Patent
Chang et al.

(10) Patent No.: US 12,191,242 B2
(45) Date of Patent: Jan. 7, 2025

(54) CONTACT ARRANGEMENT AND ELECTRONIC ASSEMBLY

(71) Applicant: VIA Technologies, Inc., New Taipei (TW)

(72) Inventors: Nai-Shung Chang, New Taipei (TW); Yun-Han Chen, New Taipei (TW); Tsai-Sheng Chen, New Taipei (TW); Chang-Li Tan, New Taipei (TW); Sheng-Bang Ou Yang, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 412 days.

(21) Appl. No.: 17/580,664

(22) Filed: Jan. 21, 2022

(65) Prior Publication Data
US 2023/0163058 A1 May 25, 2023

(30) Foreign Application Priority Data

Nov. 24, 2021 (TW) .................... 110143761

(51) Int. Cl.
*H01L 23/498* (2006.01)
*H05K 1/02* (2006.01)
*H05K 1/11* (2006.01)

(52) U.S. Cl.
CPC ..... *H01L 23/49838* (2013.01); *H05K 1/0245* (2013.01); *H05K 1/112* (2013.01); *H05K 2201/09227* (2013.01); *H05K 2201/094* (2013.01)

(58) Field of Classification Search
CPC . H01L 23/49838; H01L 23/498; H01L 24/06; H01L 24/09; H05K 1/0245; H05K 1/0298; H05K 1/112; H05K 1/141; H05K 1/02; H05K 1/11; H05K 2201/09227; H05K 2201/094
USPC ......................................... 361/222
See application file for complete search history.

(56) References Cited

U.S. PATENT DOCUMENTS 8,380,927 B2 * 2/2013 Perego ................. G06F 13/409
710/305

FOREIGN PATENT DOCUMENTS

CN 112218425 A * 1/2021 ........... H01R 12/727

OTHER PUBLICATIONS

DDR4 SDRAM 288pin Registered DIMM_Samsung_pp. 1-40_Apr. 2015.*
DDR5 SDRAM UDIMM Core_Micron_pp. 1-20_Oct. 2021.*

* cited by examiner

Primary Examiner — Timothy J Thompson
Assistant Examiner — Guillermo J Egoavil
(74) Attorney, Agent, or Firm — JCIPRNET

(57) ABSTRACT

A contact arrangement includes a plurality of contact groups. At least one of the contact groups includes a plurality of shared contacts, a plurality of dedicated contacts, and a plurality of ground contacts. The shared contacts in a first mode or a second mode transmit signals corresponding to the first mode or the second mode. The dedicated contacts transmit the signals corresponding to the first mode and do not transmit the signals corresponding to the second mode. The ground contacts surround the shared contacts and the dedicated contacts.

30 Claims, 11 Drawing Sheets

Data/Strobe

| Pin position | DDR5 | DDR4 UDIM | DDR4 RDIM | LPDDR5 |
|---|---|---|---|---|
| A1 | MDQSA0- | MDQSA0- | MDQSA0- | LPD5_RDQSA0- |
| A2 | MDQSA0+ | MDQSA0+ | MDQSA0+ | LPD5_RDQSA0+ |
| A3 | NC | NC | DDR4_MDQS9- | LPD5_WCLKOA0- |
| A4 | NC | NC | DDR4_MDQS9+ | LPD5_WCLKOA0+ |

FIG. 5A

CLK/Clock

| Pin position | DDR5/LPDDR5 | DDR4 |
|---|---|---|
| B1 | BCLK0AB0- | MCLK0A0- |
| B2 | BCLK0AB0- | MCLK0A0+ |
| B3 | BCLK0AB4- | NC |
| B4 | BCLK0AB4+ | NC |

FIG. 7A

CONTACT ARRANGEMENT AND ELECTRONIC ASSEMBLY

CROSS-REFERENCE TO RELATED APPLICATION

This application claims the priority benefit of Taiwan application serial no. 110143761, filed on Nov. 24, 2021. The entirety of the above-mentioned patent application is hereby incorporated by reference herein and made a part of this specification.

BACKGROUND

Technical Field

The disclosure relates to a contact arrangement; more particularly, the disclosure relates to a contact arrangement and an electronic assembly applying the contact arrangement.

Description of Related Art

Different market applications result in various specifications of memory modules. The specifications of the memory modules include a double-data-rate (DDR) registered dual in-line memory module (RDIM) mode applicable to servers, a DDR unregistered dual in-line memory module (UDIM) mode applicable to desktop computers, a low-power double-date-rate (LPDDR) mode recently applicable to handheld devices and laptops, and so on. With different working speeds, the specifications of the memory modules are also divided into a first generation, a second generation, etc. At present, the specifications of the mainstream memory modules include a DDR4 RDIMM mode, the DDR4 UDIMM mode, a DDR5 UDIMM mode, and an LPDDR5 mode. Due to the different packaging requirements of different memory modules, individual designs of the memory modules are required, which may increase the design costs.

SUMMARY

The disclosure provides a contact arrangement that allows signal transmission in a plurality of different memory module modes.

The disclosure provides an electronic assembly of which a contact arrangement allows signal transmission in a plurality of different memory module modes.

In an embodiment of the disclosure, a contact arrangement that includes a plurality of contact groups is provided. At least one of the contact groups includes a plurality of shared contacts, a plurality of dedicated contacts, and a plurality of ground contacts. The shared contacts in a first mode or a second mode transmit signals corresponding to the first mode or the second mode. The dedicated contacts transmit the signals corresponding to the first mode and do not transmit the signals corresponding to the second mode. The ground contacts surround the shared contacts and the dedicated contacts.

In an embodiment of the disclosure, an electronic assembly includes a wiring board having said contact arrangement.

In view of the above, according to one or more embodiments of the disclosure, under the specification that supports a plurality of different memory modules at the same time, signals corresponding to different modes (specifications) are transmitted through the shared contacts, signals corresponding to a certain mode (specification) are transmitted through one or more of the dedicated contacts, and the ground contacts surround the shared contacts and the dedicated contacts to ensure the quality of signal transmission.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5A is a multiplexing table of data signals.

FIG. 7A is a multiplexing table of clock signals.

DESCRIPTION OF THE EMBODIMENTS

Figure 1:
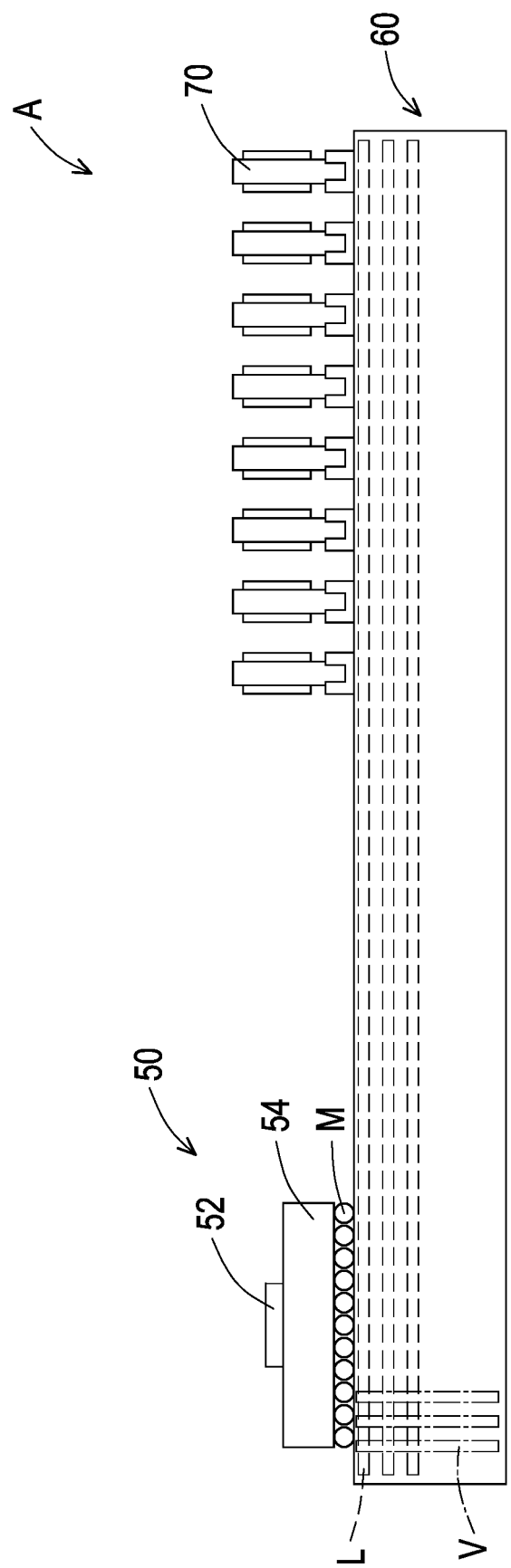
FIG. 1 illustrates an electronic assembly according to an embodiment of the disclosure.
Figure 2:
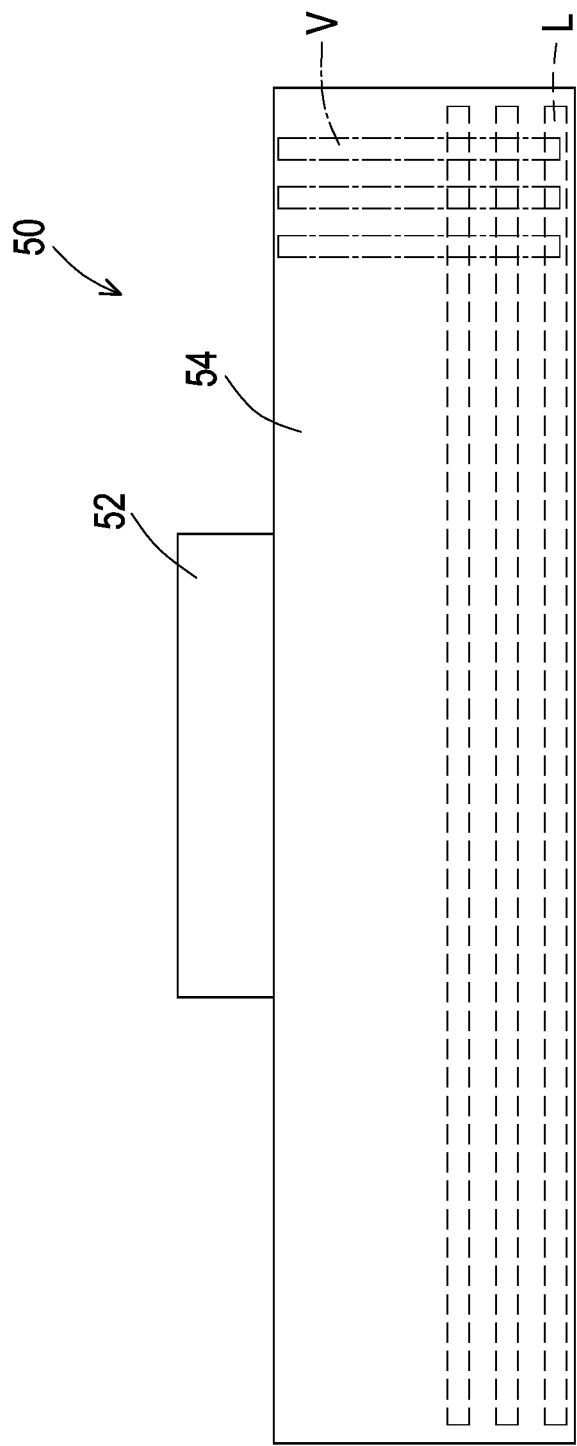
FIG. 2 illustrates a chip package of FIG. 1.

With reference to FIG. 1 and FIG. 2, a chip package 50 acting as a memory driving device includes a chip 52 and a package substrate 54. The chip 52 is installed to the package substrate 54. By installing or assembling the chip package 50 to a motherboard 60 of a computer (or a similar device), a plurality of memory modules 70 on the motherboard 60 may be driven. The memory modules 70 may be compatible with a plurality of different specifications, including a DDR4 UDIMM mode, a DDR4 RDIMM mode, a DDR5 mode, or an LPDDR5 mode, which should however not be construed as a limitation in the disclosure. A printed circuit board (PCB) of the motherboard 60 and a PCB of the package substrate 54 may be considered as a wiring board, respectively. In this embodiment, an electronic assembly A may include the chip package 50 and the motherboard 60, and may also include the memory modules 70. On the other hand, the chip package 50 may be considered as an electronic assembly constituted by the chip 52 and the package substrate 54.

Figure 3:
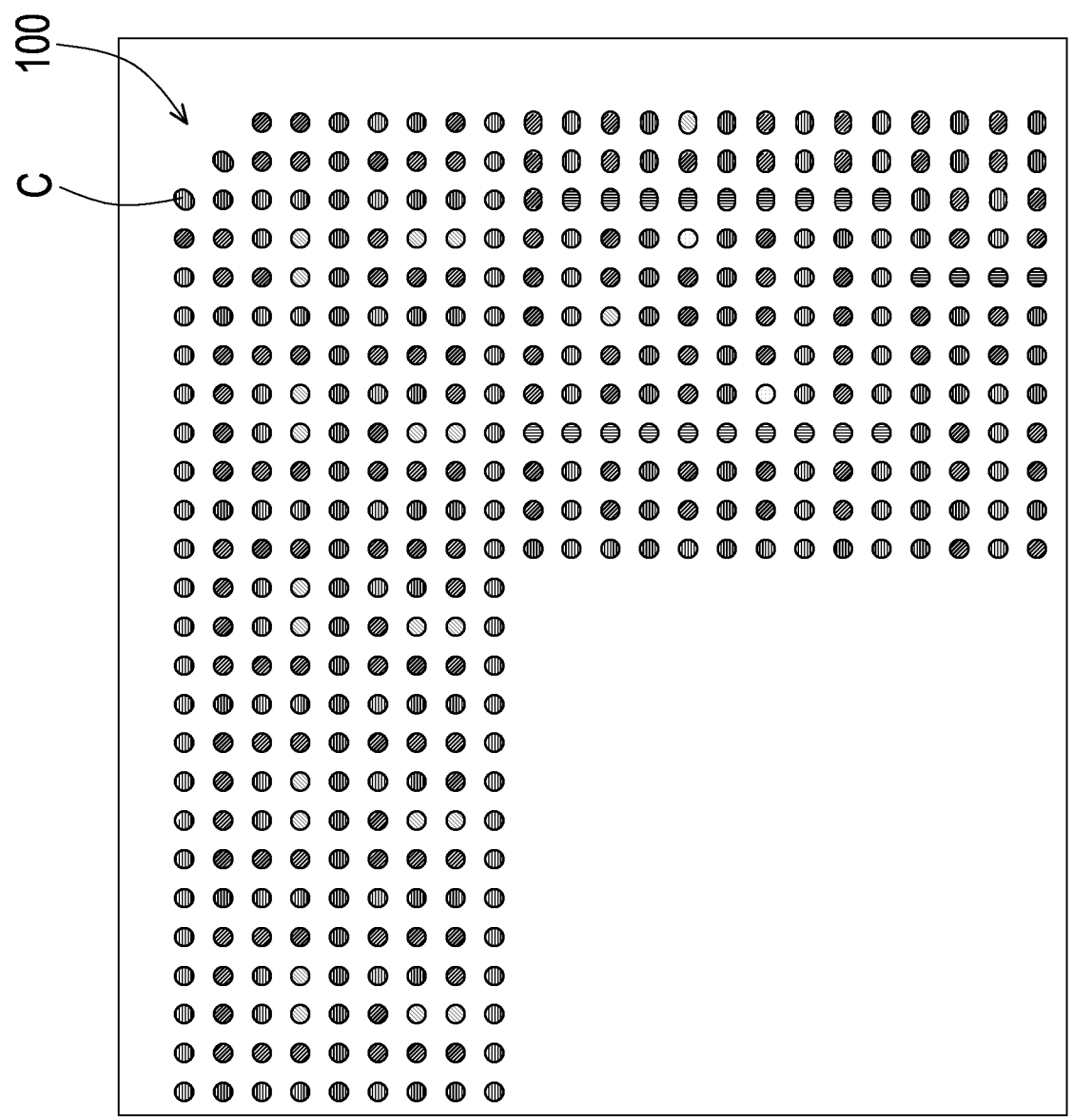
FIG. 3 illustrates a contact arrangement according to an embodiment of the disclosure.
Figure 4:
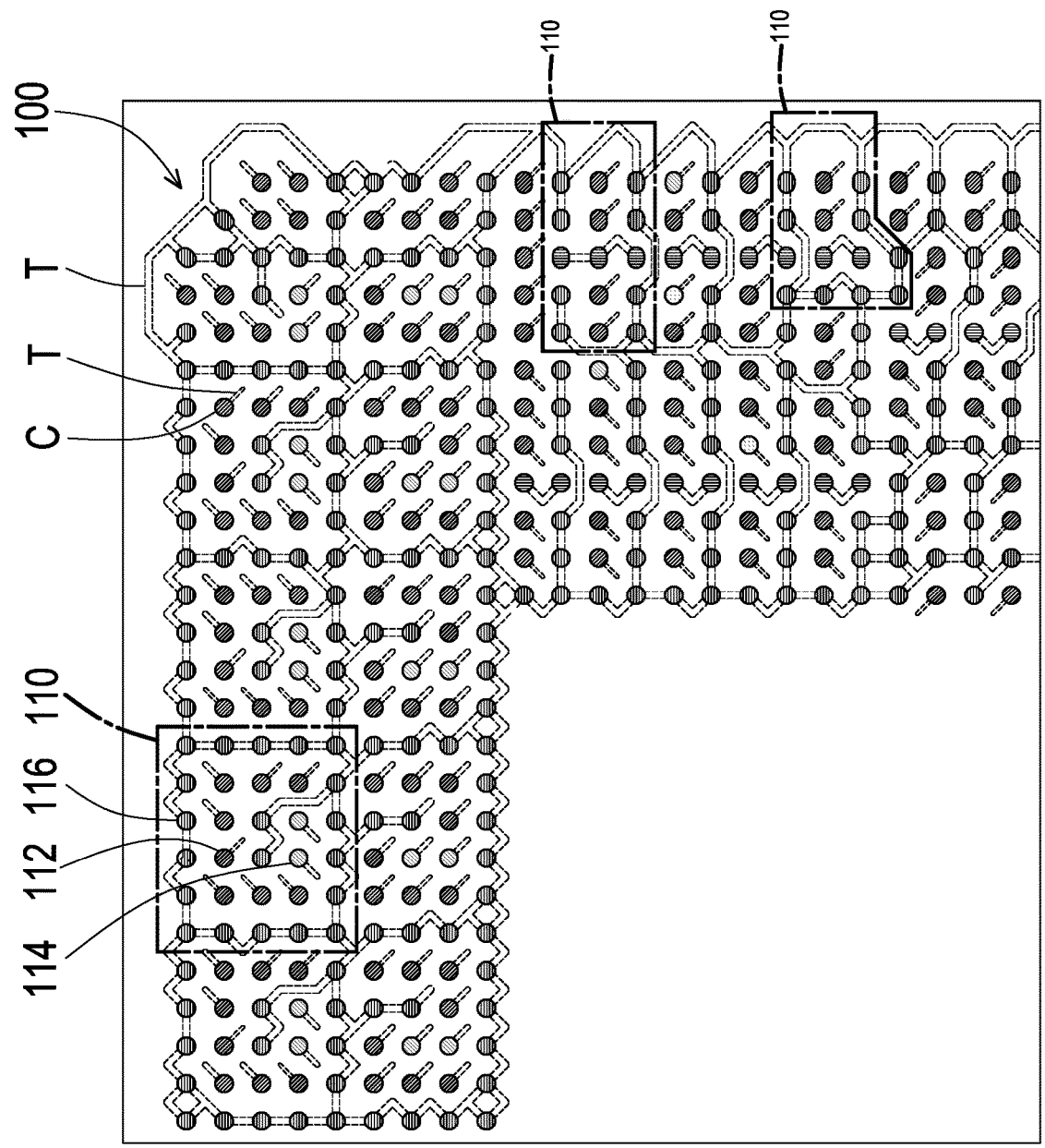
FIG. 4 illustrates the contact arrangement and traces of FIG. 3.

In an embodiment of the disclosure, a contact arrangement 100 is provided as shown in FIG. 3. The contact arrangement 100 may be applied as a pad arrangement at the chip package 50 or a pad arrangement at the motherboard 60 in FIG. 1, and the contact arrangement 100 may also be applied as a conductive medium arrangement between the chip package 50 and the motherboard 60. The arrangement of the conductive medium M is, for instance, an arrangement of conductive pads, an arrangement of conductive balls, an arrangement of conductive pins, an arrangement of conductive elastic terminals, and so forth, which should however not be construed as a limitation in the disclosure. In addition, the contact arrangement at the package substrate 54 of the chip package 50 and the contact arrangement at the motherboard 60 have a mirror image relationship, so as to achieve electrical connection. With reference to FIG. 3 and FIG. 4, in this embodiment, the contact arrangement 100 may be constituted by exposed portions of wiring layers L of the wiring board (e.g., the wiring layers L of the motherboard 60 in FIG. 1 or the wiring layers L of the package substrate 54 in FIG. 2). In addition to the contact arrangement 100 depicted in FIG. 3, in FIG. 4, plural traces T formed by the wiring layers L are further represented by dashed lines.

As shown in FIG. 4, the contact arrangement 100 is composed of a plurality of contacts C and includes a plurality of contact groups 110. At least one of the contact groups 110 includes a plurality of shared contacts 112, a plurality of dedicated contacts 114, and a plurality of ground contacts 116. The shared contacts 112 in a first mode or a second mode may transmit signals corresponding to the first mode or the second mode. The first mode is, for instance, one of a DDR4 UDIMM mode, a DDR4 RDIMM mode, a DDR5 mode, and an LPDDR5 mode of the memory modules 70, and the second mode is, for instance, another of the DDR4 UDIMM mode, the DDR4 RDIMM mode, the DDR5 mode, and the LPDDR5 mode of the memory modules 70. That is, the first mode and the second mode are two different modes of the memory modules 70. The dedicated contacts 114 (non-shared contacts) may transmit the signals corresponding to the first mode and do not transmit the signals corresponding to the second mode. It means the dedicated contacts 114 are dummy signal contacts in the second mode. Alternatively, the dedicated contacts 114 (the non-shared contacts) may transmit the signals corresponding to the second mode and do not transmit the signals corresponding to the first mode. It means the dedicated contacts 114 are dummy signal contacts in the first mode. The ground contacts 116 surround the shared contacts 112 and the dedicated contacts 114.

The contact arrangement 100 provided in one or more embodiments of the disclosure may support the DDR4 UDIMM mode (specification), the DDR4 RDIMM mode, the DDR5 mode, or the LPDDR5 mode of the memory modules 70 at the same time, and the signals corresponding to these modes (specifications) may be divided into three types, including clock (CLK/Clock) signals, data (Data/Strobe) signals, and control (Control/CMD) signals, which belong to three contact groups 110 marked in a box depicted in FIG. 4. The descriptions of the contact groups 110 are respectively provided below.

Figure 5B:
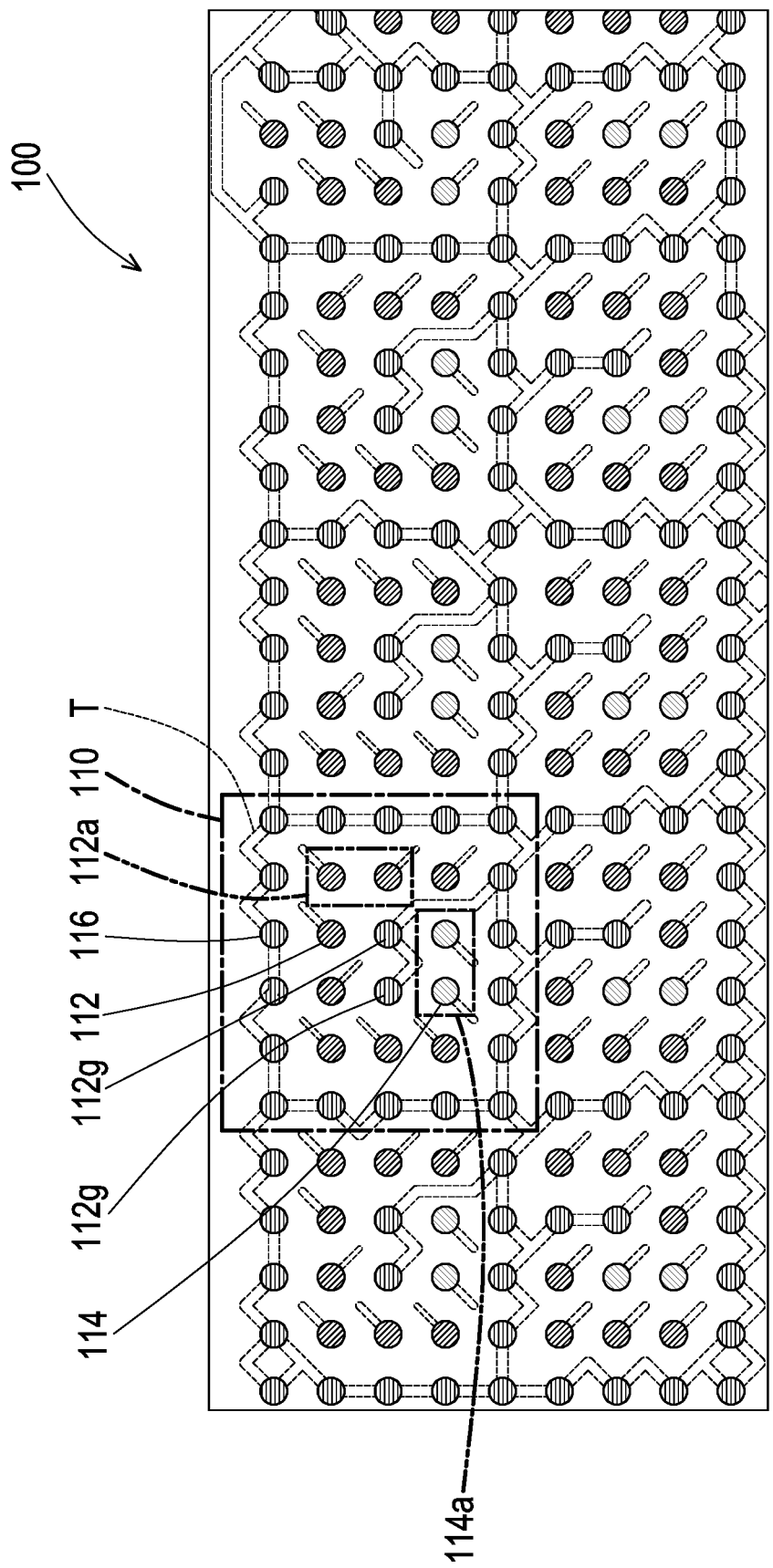
FIG. 5B is an enlarged view illustrating a portion of the contact arrangement of FIG. 4 in association with data signals.

With reference to FIG. 5A and FIG. 5B, in the same contact group 110, the shared contacts 112 are configured to transmit data signals (Data/Strobe) corresponding to the DDR4 UDIMM mode, the DDR4 RDIMM mode, the DDR5 mode, or the LPDDR5 mode. Two of the shared contacts 112 constitute a shared contact differential pair 112a (e.g., as shown by pin positions A1 and A2 in FIG. 5A), which is configured to transmit data signals corresponding to the DDR4 UDIMM mode, the DDR4 RDIMM mode, the DDR5 mode, or the LPDDR5 mode. In addition, two of the dedicated contacts 114 constitute a dedicated contact differential pair 114a. The dedicated contact differential pair 114a merely transmits data signals corresponding to the DDR4 RDIMM mode or the LPDDR5 mode. When the memory module is in the DDR4 UDIMM mode or the DDR5 mode, the dedicated contact differential pair 114a is in a normally closed (NC) state (e.g., as shown by pin positions A3 and A4 in FIG. 5A). It means the dedicated contact differential pair 114a is a dummy contact differential pair in the DDR4 UDIMM mode or the DDR5 mode. In addition, two of the shared contacts 112 (i.e., the shared contacts 112g) of the same contact group 110 are in a ground state to serve as the reference loop of the signals. In this embodiment, the ground contacts 116 are substantially located on the peripheries of one contact group 110 and surround the shared contact differential pair 112a and the dedicated contact differential pair 114a. The ground contacts 116 may be connected to each other through the traces T and may be connected to the shared contacts 112g (configured to be grounded) through the traces T.

Figure 5C:
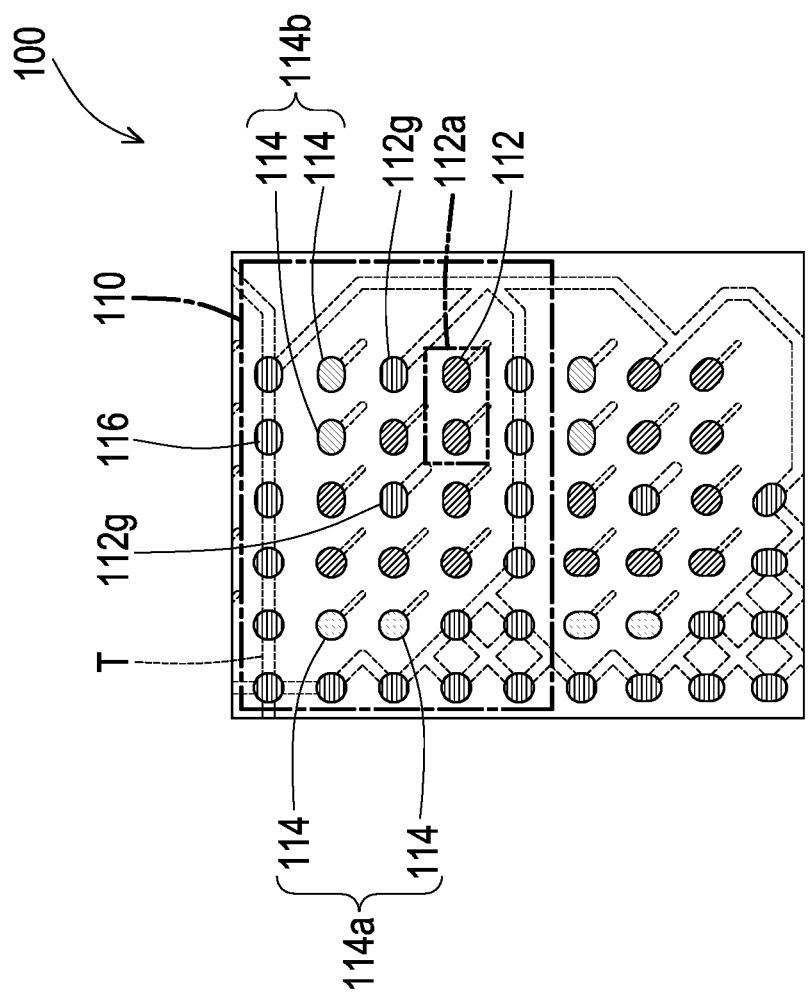
FIG. 5C is an enlarged view illustrating a portion of a contact arrangement according to another embodiment of the disclosure.

As shown in FIG. 5B, in this embodiment, a sum of the shared contacts 112 and the dedicated contacts 114 of the same contact group 110 is at least 12. As shown in FIG. 5C, in another embodiment, a sum of the shared contacts 112 and the dedicated contacts 114 of the same contact group 110 is 14. In the embodiment depicted in FIG. 5B and FIG. 5C, the contact group 110 includes one shared contact differential pair 112a and two dedicated contact differential pairs 114a and 114b. The two dedicated contact differential pairs 114a and 114b in the DDR4 RDIMM mode or the LPDDR5 mode transmit the corresponding data signals, while the two dedicated contact differential pairs 114a and 114b in the DDR4 UDIMM mode or the DDR5 mode are in an NC state. It means the two dedicated contact differential pairs 114a and 114b are dummy contact differential pairs in the DDR4 UDIMM mode or the DDR5 mode.

Figure 6:
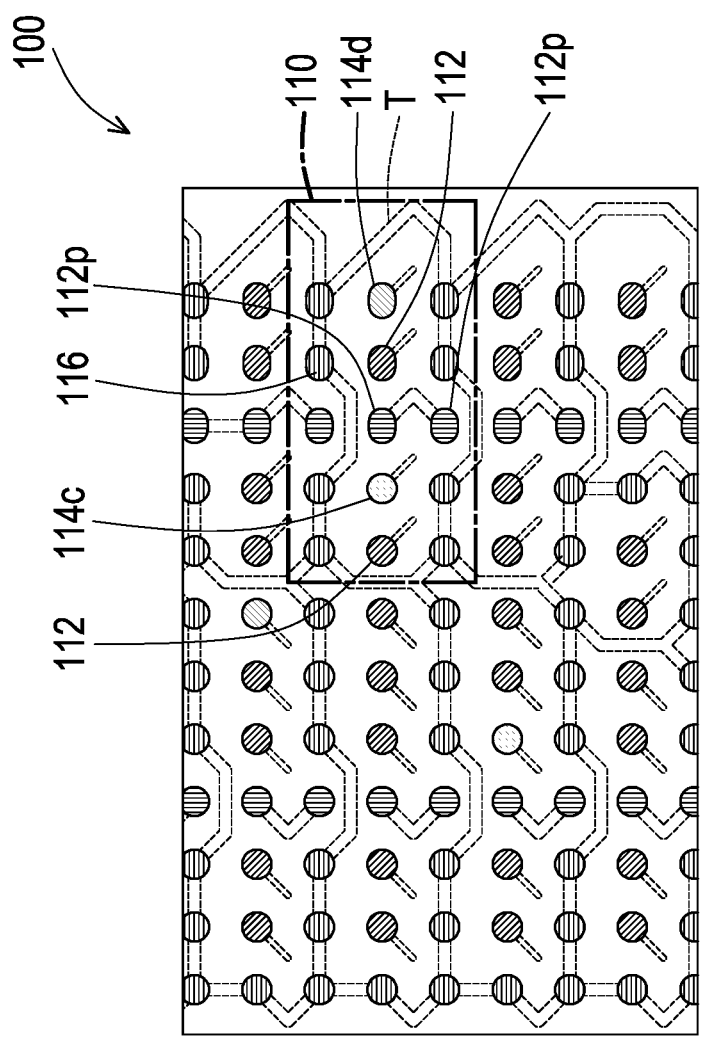
FIG. 6 is an enlarged view illustrating a portion of the contact arrangement of FIG. 4 in association with control signals.

With reference to FIG. 6, in the same contact group 110, the shared contacts 112 in the DDR4 mode (the DDR4 UDIMM mode or the DDR4 RDIMM mode) or the DDR5 mode (or the LPDDR5 mode) transmit corresponding control signals (Control/CMD). In an embodiment, at least one of the dedicated contacts 114 of the same contact group 110 is a dedicated contact 114c of the DDR5 mode (or the LPDDR5 mode). In the DDR5 mode (or the LPDDR5 mode), the dedicated contact 114c merely transmits the control signals corresponding to the DDR5 mode (or the LPDDR5 mode). In other words, in the DDR4 mode (the DDR4 UDIMM mode or the DDR4 RDIMM mode), the dedicated contact 114c is in an NC state. It means the dedicated contact 114c is a dummy contact in the DDR4 mode. In another embodiment, at least one of the dedicated contacts 114 of the same contact group 110 is a dedicated contact 114d of the DDR4 mode (the DDR4 UDIMM mode or the DDR4 RDIMM mode). In the DDR4 mode (the DDR4 UDIMM mode or the DDR4 RDIMM mode), the dedicated contact 114d merely transmits the control signals corresponding to the DDR4 mode (the DDR4 UDIMM mode or the DDR4 RDIMM mode). In other words, in the DDR5 mode (or the LPDDR5 mode), the dedicated contact 114d is in an NC state. It means the dedicated contact 114d is a dummy contact in the DDR5 mode. In another embodiment, at least two dedicated contacts 114c and 114d of the dedicated contacts 114 respectively in the DDR4 UDIMM mode, the DDR4 RDIMM mode, the DDR5 mode, or the LPDDR5 mode transmit the corresponding control signals. In addition, two of the shared contacts 112 (i.e., shared contacts 112p) are in a power state and may serve as a reference loop of signals. In this embodiment, the ground contacts 116 are substantially located on the peripheries of one contact group 110 and surround the shared contacts 112, the dedicated contacts 114c, 114d, and the shared contacts 112p configured for the power source. The ground contacts 116 may be connected to each other through the traces T.

Figure 7B:
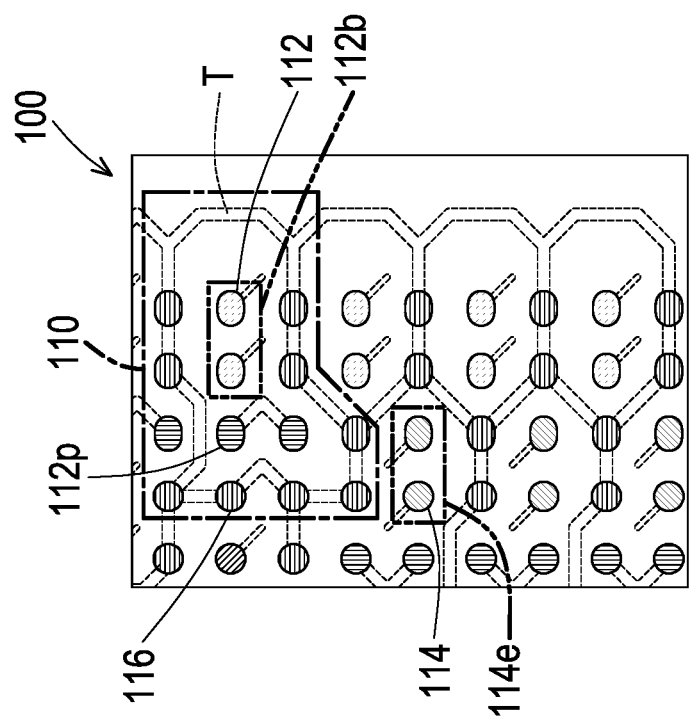
FIG. 7B is an enlarged view illustrating a portion of the contact arrangement of FIG. 4 in association with clock signals.
Figure 8B:
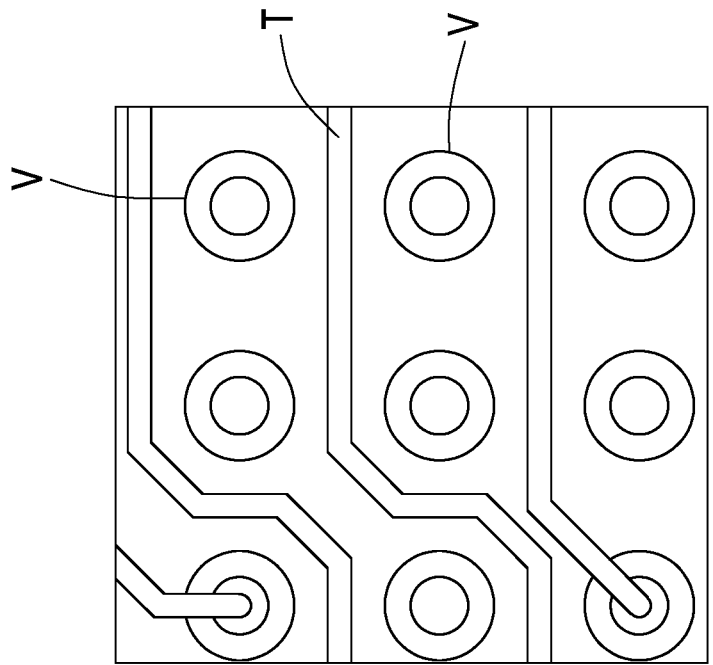
FIG. 8B illustrates a circuit layout of the remaining wiring layers excluding the wiring layer closest to the surface of the wiring board.
Figure 8A:
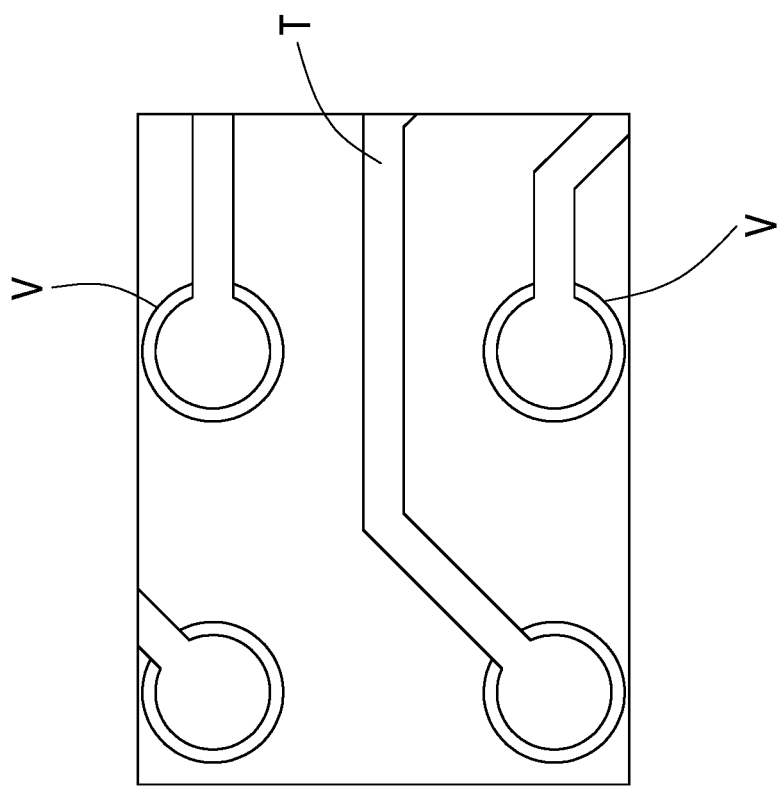
FIG. 8A illustrates a circuit layout of a wiring layer closest to a surface of the wiring board.

With reference to FIG. 7A and FIG. 7B, in the same contact group 110, the shared contacts 112 in the DDR4 mode (the DDR4 UDIMM mode or the DDR4 RDIMM mode) or the DDR5 mode (or the LPDDR5 mode) transmit corresponding clock signals (CLK/Clock). In the same contact group 110, two of the shared contacts 112 may constitute a shared contact differential pair 112b (e.g., as shown by pin positions B1 and B2 in FIG. 7A) and may be configured to transmit the clock signals corresponding to the DDR4 mode (the DDR4 UDIMM mode or the DDR4 RDIMM mode) or the DDR5 mode (or the LPDDR5 mode). Two of the shared contacts 112 (e.g., the shared contacts 112p) may be in a power state, so that the two shared contacts and the ground contacts 116 may collectively isolate the clock signals. Two of the dedicated contacts 114 may constitute a dedicated contact differential pair 114e (e.g., as shown by pin positions B3 and B4 in FIG. 7A). The dedicated contact differential pair 114e merely transmits the clock signals corresponding to the DDR5 mode (or the LPDDR5 mode). When the memory module is in the DDR4 mode (the DDR4 UDIMM mode or the DDR4 RDIMM mode), the dedicated contact differential pair 114e is in an NC state. It means the dedicated contact differential pair 114e is a dummy contact differential pair in the DDR4 mode. In this embodiment, the ground contacts 116 are substantially located on the peripheries of one contact group 110 and surround the shared contact differential pair 112c or the dedicated contact differential pair 114e, and the ground contacts 116 may connected to each other through the traces T. In this embodiment, the ground contacts 116 are substantially located on the peripheries of one contact group 110 and surround the dedicated contact differential pair 114e and the shared power contacts 112p. In this embodiment, these ground contacts 116 are substantially located on the peripheries of one contact group 110 and surround the shared contact differential pair 112c and the shared contacts 112p configured for the power source.

With reference to FIG. 7B, in this embodiment, the contact groups 110 include a contact group 110 having a dedicated contact differential pair 114e and a contact group 110 having a shared contact differential pair 112b, and the contact group 110 having the shared contact differential pair 112b is farther away from a shape center of the contact groups 110 than the contact group 110 having the dedicated contact differential pair 114e. In other words, the contact group 110 having the shared contact differential pair 112b is located in a relatively peripheral region. In addition, in another embodiment not shown in the drawings, the contact group 110 may include a shared contact differential pair 112b and a dedicated contact differential pair 114e at the same time, and the shared contact differential pair 112b is farther away from a shape center of the contact groups 110 than the dedicated contact differential pair 114e.

With reference to FIG. 1, FIG. 2, FIG. 8A, and FIG. 8B, the wiring board (e.g., the package substrate 54 or the motherboard 60) includes a plurality of wiring layers L and a plurality of conductive vias V. The conductive vias V are connected to at least two of the wiring layers L. Excluding the wiring layer closest to a surface of the wiring board, each of the remaining wiring layers L has only one single trace T between two adjacent conductive vias of the conductive vias V.

To sum up, according to one or more embodiments of the disclosure, under the specification that supports a plurality of different memory modules at the same time, signals corresponding to different modes (specifications) are transmitted through the shared contacts, signals corresponding to a certain mode (specification) are transmitted through one or more of the dedicated contacts, and the ground contacts surround the shared contacts and the dedicated contacts to ensure the quality of signal transmission.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A contact arrangement, adapted to be in a wiring board, the wiring board comprising a package substrate or a motherboard, the contact arrangement comprising:
   a plurality of contact groups, wherein at least one of the contact groups comprises:
   a plurality of shared contacts, transmitting in a first mode or a second mode signals corresponding to a first memory mode or a second memory mode;
   a plurality of dedicated contacts, transmitting the signals corresponding to the first mode and not transmitting the signals corresponding the second mode; and
   a plurality of ground contacts, surrounding the shared contacts and the dedicated contacts.

2. The contact arrangement according to claim 1, wherein two of the shared contacts constitute a shared contact differential pair to transmit data signals in a DDR4 UDIMM mode, a DDR4 RDIMM mode, a DDR5 mode, or an LPDDR5 mode.

3. The contact arrangement according to claim 1, wherein two of the dedicated contacts constitute a dedicated contact differential pair, the dedicated contact differential pair in the DDR4 RDIMM mode or the LPDDR5 mode transmits corresponding data signals, and the dedicated contact differential pair in the DDR4 UDIMM mode or the DDR5 mode is in a normally closed state.

4. The contact arrangement according to claim 1, wherein two of the shared contacts are in a ground state to serve as a reference loop of signals.

5. The contact arrangement according to claim 1, wherein a sum of the shared contacts and the dedicated contacts is at least 12.

6. The contact arrangement according to claim 1, wherein a sum of the shared contacts and the dedicated contacts is 14, four of the dedicated contacts constitute two dedicated contact differential pairs, the dedicated contact differential pairs in the DDR4 RDIMM mode or the LPDDR5 mode transmit corresponding data signals, and the dedicated contact differential pairs in the DDR4 UDIMM mode or the DDR5 mode are in a normally closed state.

7. The contact arrangement according to claim 1, wherein the first mode is one of the DDR4 RDIMM mode and the LPDDR5 mode, and the second mode is one of the DDR4 UDIMM mode and the DDR5 mode.

8. The contact arrangement according to claim 1, wherein the shared contacts in the DDR4 UDIMM mode, the DDR4

RDIMM mode, the DDR5 mode, or the LPDDR5 mode transmit corresponding control signals.

9. The contact arrangement according to claim 1, wherein at least one of the dedicated contacts in the DDR5 mode or the LPDDR5 mode transmits corresponding control signals, and the at least one of the dedicated contacts in the DDR4 UDIMM mode or the DDR4 RDIMM mode is in a normally closed state.

10. The contact arrangement according to claim 1, wherein at least one of the dedicated contacts in the DDR4 UDIMM mode or the DDR4 RDIMM mode transmits corresponding control signals, and the at least one of the dedicated contacts in the DDR5 mode or the LPDDR5 mode is in a normally closed state.

11. The contact arrangement according to claim 1, wherein the dedicated contacts at least comprise a first dedicated contact and a second dedicated contact, the first dedicated contact is applied in one of the DDR4 UDIMM mode and the DDR4 RDIMM mode, and the second dedicated contact is applied in one of the DDR5 mode and the LPDDR5 mode.

12. The contact arrangement according to claim 1, wherein two of the shared contacts are in a power state to serve a reference loop of signals.

13. The contact arrangement according to claim 1, wherein two of the shared contacts constitute a shared contact differential pair, and the shared contact differential pair in the DDR4 UDIMM mode, the DDR4 RDIMM mode, the DDR5 mode, or the LPDDR5 mode transmits corresponding clock signals.

14. The contact arrangement according to claim 1, wherein two of the shared contacts are in a power state to isolate the clock signal with the ground contacts.

15. The contact arrangement according to claim 1, wherein two of the dedicated contacts constitute a dedicated contact differential pair, the dedicated contact differential pair in the DDR5 mode or the LPDDR5 mode transmits corresponding clock signals, and the dedicated contact differential pair in the DDR4 UDIMM mode or the DDR4 RDIMM mode is in a normally closed state.

16. The contact arrangement according to claim 1, wherein the contact groups comprise a first contact group having a dedicated contact differential pair and a second contact group having a shared contact differential pair, and the second contact group having the shared contact differential pair is farther away from a shape center of the contact groups than the first contact group having the dedicated contact differential pair.

17. The contact arrangement according to claim 1, wherein the contact groups comprise a shared contact differential pair and a dedicated contact differential pair, and the shared contact differential pair is farther away from a shape center of the contact groups than the dedicated contact differential pair.

18. The contact arrangement according to claim 1, wherein the wiring board comprises a plurality of wiring layers and a plurality of conductive vias, the conductive vias are connected to at least two of the wiring layers, and excluding one of the wiring layers closest to a surface of the wiring board, each of the remaining wiring layers has one single trace between two adjacent conductive vias of the conductive vias.

19. An electronic assembly, comprising:
a wiring board, having a contact arrangement, the contact arrangement comprising:
a plurality of contact groups, wherein at least one of the contact groups comprises:
a plurality of shared contacts, transmitting in a first mode or a second mode signals corresponding to a first memory mode or a second memory mode;
a plurality of dedicated contacts, transmitting the signals corresponding to the first mode and not transmitting the signals corresponding to the second mode; and
a plurality of ground contacts, surrounding the shared contacts and the dedicated contacts.

20. The electronic assembly according to claim 19, comprising:
a chip, installed to the wiring board.

21. The electronic assembly according to claim 19, further comprising:
a chip package, installed to the wiring board.

22. The electronic assembly according to claim 19, wherein the wiring board comprises a plurality of wiring layers and a plurality of conductive vias, the conductive vias are connected to at least two of the wiring layers, and excluding one of the wiring layers closest to a surface of the wiring board, each of the remaining wiring layers has one single trace between two adjacent conductive vias of the conductive vias.

23. The electronic assembly according to claim 19, wherein two of the shared contacts constitute a shared contact differential pair to transmit data signals in a DDR4 UDIMM mode, a DDR4 RDIMM mode, a DDR5 mode, or an LPDDR5 mode.

24. The electronic assembly according to claim 19, wherein two of the dedicated contacts constitute a dedicated contact differential pair, the dedicated contact differential pair in a DDR4 RDIMM mode or an LPDDR5 mode transmits corresponding data signals, and the dedicated contact differential pair in a DDR4 UDIMM mode or a DDR5 mode is in a normally closed state.

25. The electronic assembly according to claim 19, wherein the shared contacts in a DDR4 UDIMM mode, in a DDR4 RDIMM mode, in a DDR5 mode, or in a LPDDR5 mode transmits corresponding control signals.

26. The electronic assembly according to claim 19, wherein at least one of the dedicated contacts in DDR5 mode or an LPDDR5 mode transmits corresponding control signals, and the at least one of the dedicated contacts in a DDR4 UDIMM mode or a DDR4 RDIMM mode is in a normally closed state.

27. The electronic assembly according to claim 19, wherein at least one of the dedicated contacts in a DDR4 UDIMM mode or a DDR4 RDIMM mode transmits corresponding control signals, and the at least one of the dedicated contacts in the DDR5 mode or the LPDDR5 mode is in a normally closed state.

28. The electronic assembly according to claim 19, wherein the dedicated contacts at least comprise a first dedicated contact and a second dedicated contact, the first dedicated contact is applied in one of a DDR4 UDIMM mode and a DDR4 RDIMM mode, and the second dedicated contact is applied in one of a DDR5 mode and an LPDDR5 mode.

29. The electronic assembly according to claim 19, wherein two of the shared contacts constitute a shared contact differential pair, and the shared contact differential pair in a DDR4 UDIMM mode, a DDR4 RDIMM mode, a DDR5 mode, or an LPDDR5 mode transmits corresponding clock signals.

30. The electronic assembly according to claim 19, wherein two of the dedicated contacts constitute a dedicated contact differential pair, the dedicated contact differential pair in a DDR5 mode or an LPDDR5 mode transmits corresponding clock signals, and the dedicated contact differential pair in a DDR4 UDIMM mode or a DDR4 RDIMM mode in a normally closed state.

\* \* \* \* \*